United States Patent
Tachikawa et al.

(10) Patent No.: US 9,148,966 B2
(45) Date of Patent: Sep. 29, 2015

(54) ELECTRONIC DEVICE

(71) Applicant: FUJITSU LIMITED, Kawasaki-shi (JP)

(72) Inventors: Hideaki Tachikawa, Inagi (JP); Shinya Matsushita, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 313 days.

(21) Appl. No.: 13/742,797

(22) Filed: Jan. 16, 2013

(65) Prior Publication Data

US 2013/0250509 A1 Sep. 26, 2013

(30) Foreign Application Priority Data

Mar. 23, 2012 (JP) ................. 2012-068130

(51) Int. Cl.
*H05K 5/00* (2006.01)
*G06F 1/16* (2006.01)

(52) U.S. Cl.
CPC ............ *H05K 5/0086* (2013.01); *G06F 1/1656* (2013.01)

(58) Field of Classification Search
USPC ..................................... 361/679.55
See application file for complete search history.

(56) References Cited

U.S. PATENT DOCUMENTS

| | | | |
|---|---|---|---|
| 3,890,480 A * | 6/1975 | Berling et al. ............. | 200/302.2 |
| 5,673,176 A * | 9/1997 | Penniman et al. ........ | 361/679.54 |
| 5,715,139 A * | 2/1998 | Nakajima ................ | 361/679.55 |
| 6,101,089 A * | 8/2000 | Seto et al. ................ | 361/679.47 |
| 6,122,167 A * | 9/2000 | Smith et al. .............. | 361/679.47 |
| 6,198,626 B1 * | 3/2001 | Nakajima et al. ........ | 361/679.55 |
| 6,347,044 B1 * | 2/2002 | Won et al. ................ | 361/807 |
| 6,542,355 B1 * | 4/2003 | Huang ...................... | 361/679.08 |
| 6,595,786 B2 * | 7/2003 | Horiuchi et al. .......... | 439/74 |
| 6,606,254 B2 * | 8/2003 | Yoneda .................... | 361/799 |
| 6,738,254 B2 * | 5/2004 | Oogami .................. | 361/679.08 |
| 6,744,622 B2 * | 6/2004 | Lee et al. ................. | 361/679.09 |
| 6,751,089 B2 * | 6/2004 | Hsieh ....................... | 361/679.09 |
| 6,900,984 B2 * | 5/2005 | Merz et al. ............... | 361/679.55 |
| 7,802,269 B2 | 9/2010 | Tsuji | |
| 2001/0015005 A1 * | 8/2001 | Chung et al. ............. | 29/458 |
| 2002/0006031 A1 * | 1/2002 | Liu ........................... | 361/756 |
| 2002/0085337 A1 * | 7/2002 | Rubenson et al. ........ | 361/680 |
| 2004/0246669 A1 * | 12/2004 | Minaguchi et al. ....... | 361/683 |
| 2005/0111202 A1 * | 5/2005 | Minaguchi et al. ....... | 361/752 |
| 2006/0176659 A1 * | 8/2006 | Sun et al. ................. | 361/683 |
| 2006/0268502 A1 * | 11/2006 | Liu et al. .................. | 361/683 |
| 2007/0019373 A1 * | 1/2007 | Yokote ..................... | 361/683 |
| 2007/0230101 A1 * | 10/2007 | Wong et al. .............. | 361/683 |
| 2008/0019085 A1 * | 1/2008 | Nakajima ................ | 361/680 |
| 2010/0091442 A1 * | 4/2010 | Theobald et al. ........ | 361/679.09 |

FOREIGN PATENT DOCUMENTS

JP 2009-110566 5/2009

* cited by examiner

*Primary Examiner* — Adrian S Wilson (74) *Attorney, Agent, or Firm* — Fujitsu Patent Center (57) ABSTRACT

An electronic device includes: a printed circuit board; a casing including an upper case that covers the printed circuit board from an upper face side and a lower case that covers the printed circuit board from a lower face side, the casing housing the printed circuit board; a keyboard interposed between the printed circuit board and the upper case; an expansion unit interposed between the keyboard and the lower case; and a support member including a lattice portion that is interposed between the keyboard and the printed circuit board and that supports the keyboard with respect to the printed circuit board, with a portion of the lattice portion formed with an expansion unit housing opening that the expansion unit is disposed in.

13 Claims, 12 Drawing Sheets

ELECTRONIC DEVICE

CROSS-REFERENCE TO RELATED APPLICATION

This application is based on and claims the benefit of priority of the prior Japanese Patent Application No. 2012-068130, filed on Mar. 23, 2012, the entire contents of which are incorporated herein by reference.

FIELD

The embodiments discussed herein are related to an electronic device.

BACKGROUND

Known electronic devices such as notebook type personal computers (referred to below as notebook PCs) include a casing, a printed circuit board housed inside the casing, and a keyboard attached from the outside (top side) to a lattice portion formed to a top wall portion of the casing.

RELATED PATENT DOCUMENTS

Japanese Laid-Open Patent Publication No. 2009-110566

SUMMARY

According to an aspect of the embodiments, an electronic device includes: a printed circuit board; a casing including an upper case that covers the printed circuit board from an upper face side and a lower case that covers the printed circuit board from a lower face side, the casing housing the printed circuit board; a keyboard interposed between the printed circuit board and the upper case; an expansion unit interposed between the keyboard and the lower case; and a support member including a lattice portion that is interposed between the keyboard and the printed circuit board and that supports the keyboard with respect to the printed circuit board, with a portion of the lattice portion formed with an expansion unit housing opening that the expansion unit is disposed in.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Explanation follows regarding an exemplary embodiment of an electronic device disclosed herein, with reference to the drawings.

Figure 1:
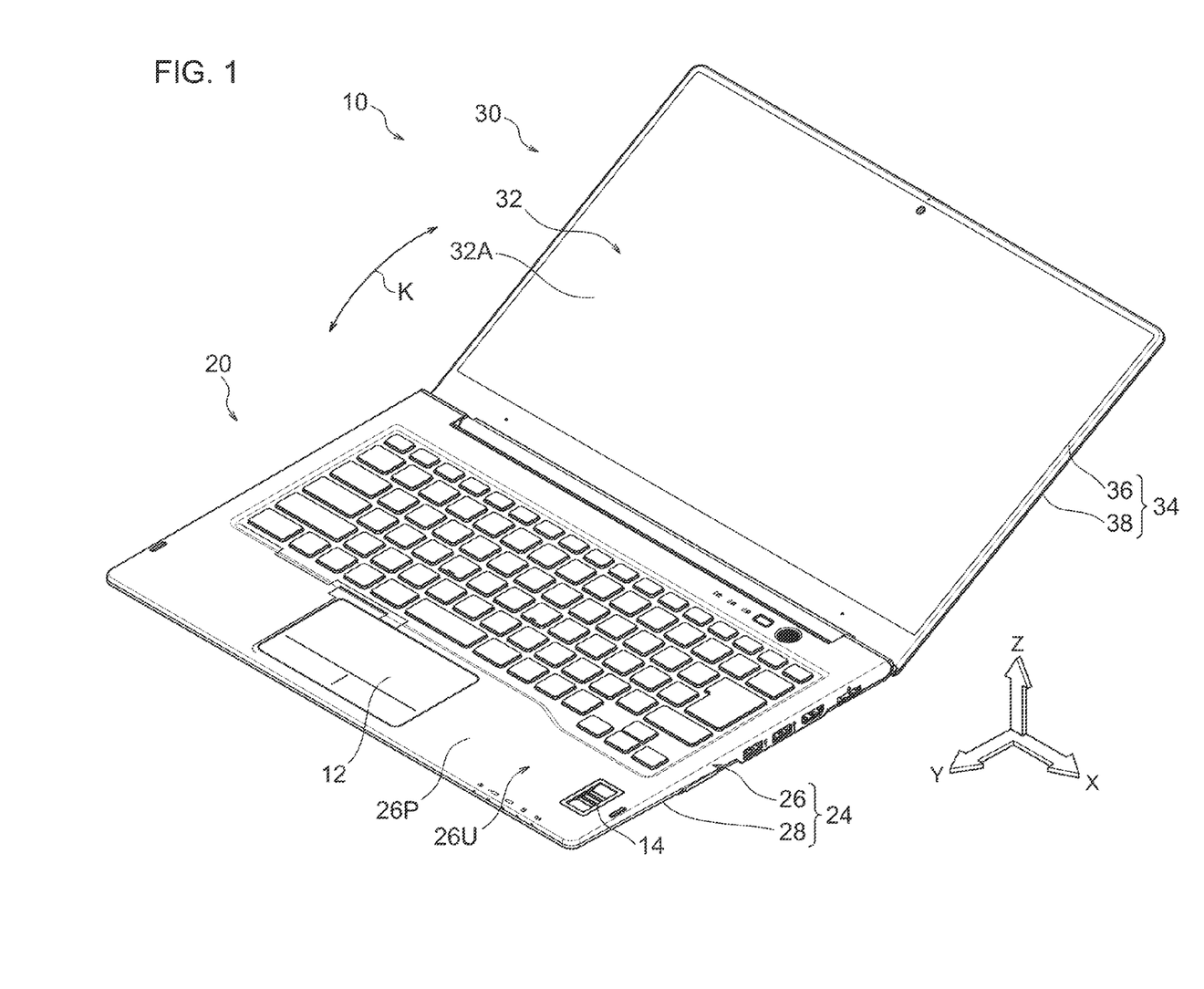
FIG. 1 is a perspective view illustrating a notebook PC that is an exemplary embodiment of an electronic device.

As illustrated in FIG. 1, a notebook PC 10 serving as an example of an electronic device is provided with a fixed side device 20 and a moveable side device 30. The moveable side device 30 is supported at a rear edge portion of the fixed side device 20 through a hinge unit, not illustrated in the drawings, so as to be capable of opening and closing (rotatable) in the arrow K directions. The moveable side device 30 is moveable between a closed position superimposed on the fixed side device 20 and an open position standing upright with respect to the fixed side device 20.

Note that in FIG. 1, the moveable side device 30 is illustrated in a state positioned in the open position. In the drawings, where appropriate the arrow X indicates the width direction (device width direction) outside (right hand side) of the fixed side device 20. The arrow Y indicates the front-rear direction (device front-rear direction) front side of the fixed side device 20. The arrow Z indicates the top-bottom direction (device top-bottom direction) top side of the fixed side device 20. In the following explanation, unless specifically indicated, references to the "front-rear" and "top-bottom" directions respectively indicate the device front-rear direction and the device top-bottom direction of the fixed side device 20 (fixed side casing 24).

The moveable side device 30 includes a display panel 32 and a moveable side casing 34 that houses the display panel 32. The front face of the display panel 32 configures a display face 32A that displays for example images and video. The moveable side casing 34 includes a front cover 36 that covers an outer peripheral portion of the display face 32A of the display panel 32, and a back cover 38 that covers the back face of the display panel 32. The front cover 36 is formed in a frame shape, with the display face 32A of the display panel 32 exposed from the inside of the front cover 36.

Figure 2:
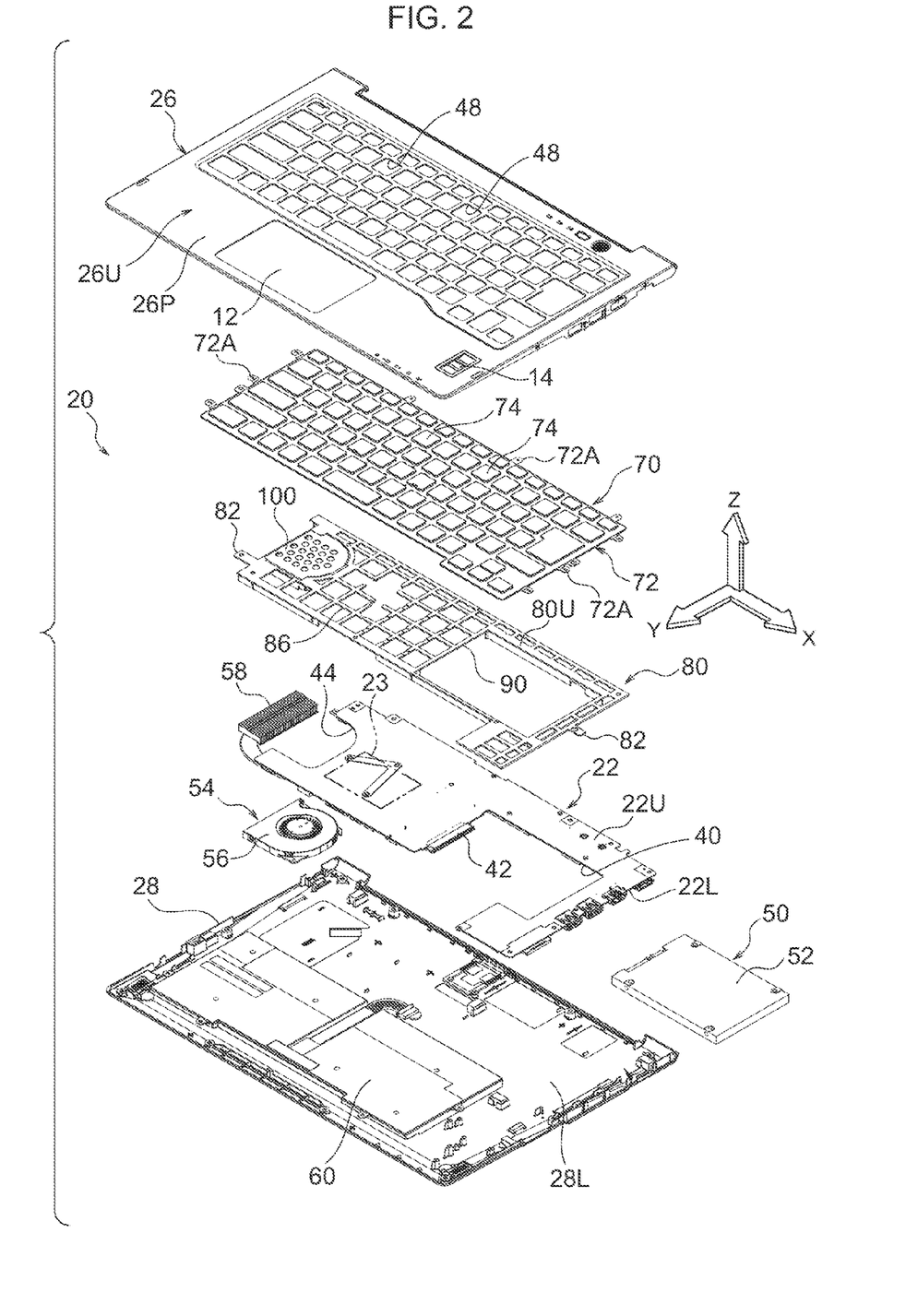
FIG. 2 is an exploded perspective view illustrating the fixed side device illustrated in FIG. 1.

As illustrated in FIG. 2, the fixed side device 20 includes a printed circuit board 22 and the fixed side casing 24 (see FIG. 1) serving as an example of a casing that houses the printed circuit board 22. The fixed side casing 24 includes an upper case 26 that covers the printed circuit board 22 from an upper face 22U side, and a lower case 28 that covers the printed circuit board 22 from a lower face 22L side. The upper case 26 is formed in a box shape open at the bottom side. The lower case 28 is formed in a box shape open at the top side. The upper case 26 and the lower case 28 face each other along the top-bottom direction and are fitted together such that the respective openings are closed off, and are coupled together with for example screws, not illustrated in the drawings.

Figure 3:
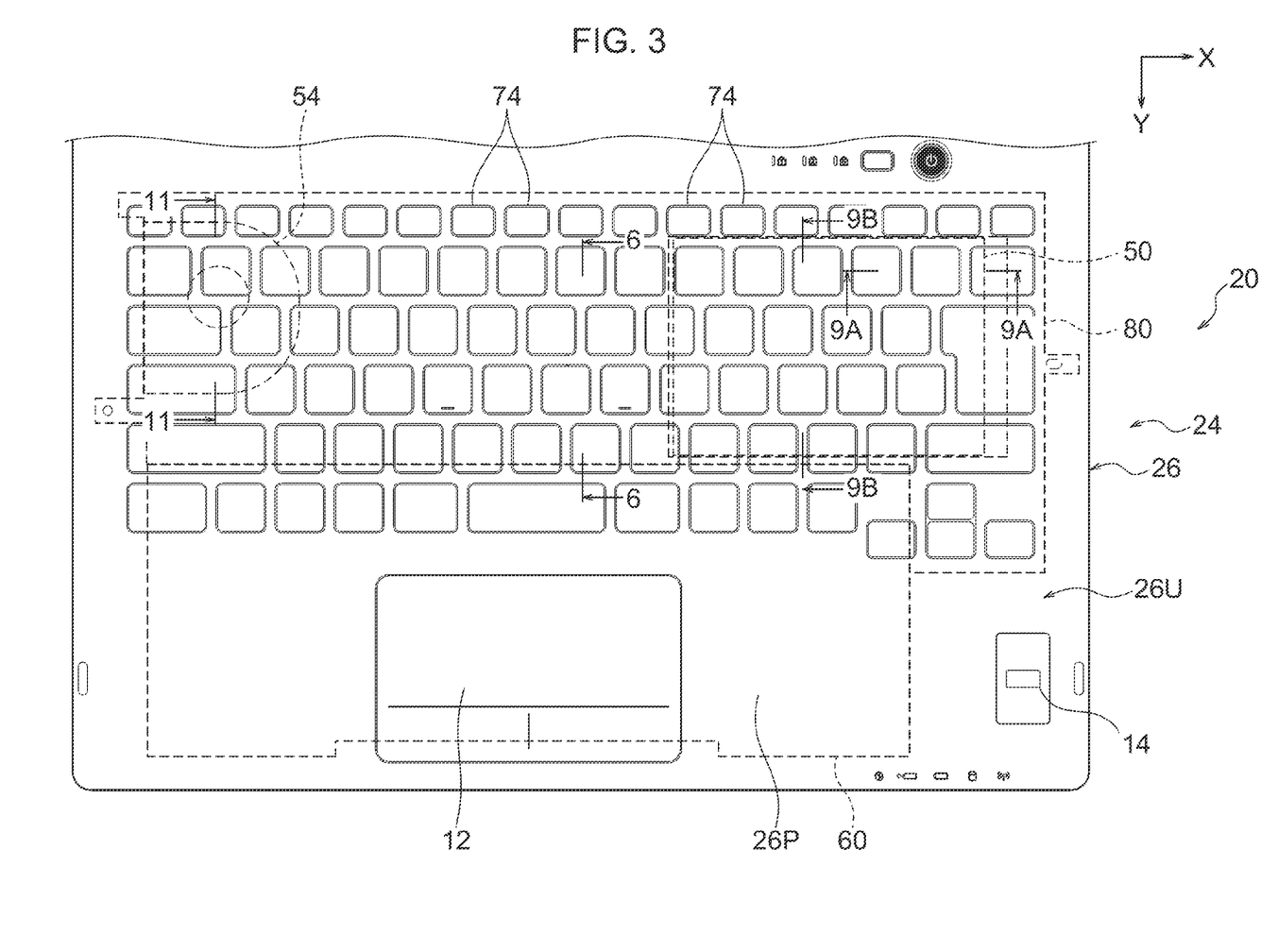
FIG. 3 is a plan view illustrating the fixed side device illustrated in FIG. 1.

At a rear edge side of the fixed side casing 24, a keyboard 70, a support frame 80 serving as an example of a support member, and the printed circuit board 22 are housed in a stacked state, in this sequence from the upper case 26 side. As illustrated in FIG. 3, a storage device 50 serving as an example of an expansion unit, described later, and a fan unit 54 serving as an example of a cooling unit are housed at the rear edge side of the fixed side casing 24. The storage device 50 and the fan unit 54 are housed in the fixed side casing 24 so as to overlap with the keyboard 70 in plan view (as viewed along the device top-bottom direction).

A battery 60 is housed at the front edge side of the fixed side casing 24, namely at a palm rest portion 26P side of the upper case 26, on which for example the wrists of a user are placed. The battery 60 is disposed to the front side of the storage device 50 and the fan unit 54, so as not to overlap with the storage device 50 and the fan unit 54 in plan view. Note that components, including a pointing device such as a touch pad 12 and a fingerprint sensor 14 that optically reads a fingerprint of the user, are provided to the palm rest portion 26P of the upper case 26.

As illustrated in FIG. 2, the printed circuit board 22 configures a main board on which plural electronic components such as a central processing unit (CPU) 23 are mounted. The printed circuit board 22 is housed with its length direction oriented in the device width direction at the rear edge side of the fixed side casing 24. An electrical circuit is formed to the printed circuit board 22 to electrically connect together the plural electronic components.

An expansion unit opening 40 for disposing the storage device 50 in is formed at a length direction first end side (right hand side) of the printed circuit board 22. The expansion unit opening 40 is formed with a rectangular shape in plan view corresponding to the external shape of the storage device 50. The storage device 50 is disposed inside the expansion unit opening 40. The storage device 50 is for example a hard disk drive (HDD) or a solid state drive (SSD). The storage device 50 includes a case 52 formed in a box shape rectangular in plan view, and a storage medium that is housed inside the case 52. The storage device 50 connects to a connector 42 provided to the printed circuit board 22 when in a disposed state in the expansion unit opening 40. The electrical circuit formed on the printed circuit board 22 and the storage device 50 are thereby electrically connected together.

A cooling unit opening 44 for disposing the fan unit 54 in is formed at a length direction second end side (left hand side) of the printed circuit board 22. The cooling unit opening 44 is formed with a rectangular shape in plan view corresponding to the external shape of the of the fan unit 54. The fan unit 54 is disposed inside the cooling unit opening 44. The fan unit 54 is a fan that generates cooling air that cools a heat sink 58 that is adjacent to the fan unit 54 in the device width direction. The fan unit 54 includes a fan case 56 formed in a box shape rectangular in plan view, and a fan that is housed inside the fan case 56. The fan is rotation driven to blow cooling air towards the heat sink 58 through a vent 56A (see FIG. 10) formed in the fan case 56.

The heat sink 58 is disposed on the opposite side of the fan unit 54 to the printed circuit board 22 (to the left hand side of the fan unit 54). The heat sink 58 is a heat exchanger that cools coolant liquid (refrigerant) by heat exchange between the coolant liquid, circulating between the heat sink 58 and the CPU 23 mounted on the printed circuit board 22, and the cooling air blown from the fan unit 54. The CPU 23 is cooled by circulating the coolant liquid between the heat sink 58 and the CPU 23 mounted on the printed circuit board 22.

The battery 60 is housed in the fixed side casing 24 at the front side of the printed circuit board 22. The battery 60 is a rechargeable battery capable of storing electric power for supply to components including the display panel 32, the CPU 23, the storage device 50, and the fan unit 54, and is electrically connected through wiring to the display panel 32 and other components. The battery 60 is formed with a thin cuboid body, with its length direction oriented in the device width direction.

The keyboard 70 is disposed above the printed circuit board 22, with the support frame 80 interposed therebetween. The keyboard 70 includes a base board 72 and plural keys 74 arrayed in the device width direction and the device front-rear direction on the upper face side of the base board 72. The keyboard 70 is disposed with its length direction oriented in the device width direction. Plural attachment portions 72A that attach to the upper case 26 are provided at outer peripheral portions of the base board 72. The keyboard 70 is attached (fixed) to an upper wall portion 26U of the upper case 26 from the lower case 28 side (lower side) by the attachment portions 72A anchoring to attachment pins 46 (see FIG. 5) that project from the lower face of the upper wall portion 26U of the upper case 26.

The plural keys 74 project to the outside of the fixed side casing 24 through plural key openings 48 formed in the upper wall portion 26U of the upper case 26 when the base board 72 is in an attached state to the upper case 26. A user is thus able to type using each of the keys 74.

The support frame 80 is made from resin and is interposed between the keyboard 70 and the printed circuit board 22. The support frame 80 is formed in a rectangular shape in plan view, and is disposed with its length direction along the device width direction. The support frame 80 is formed in a lattice pattern and includes a lattice portion 86 that supports the keyboard 70 with respect to the printed circuit board 22. The lattice portion 86 is provided spanning the entire region of the support frame 80. The support frame 80 is attached to the upper case 26 from the lower case 28 side, with the keyboard 70 in an interposed state between the support frame 80 and the upper case 26.

Figure 4:
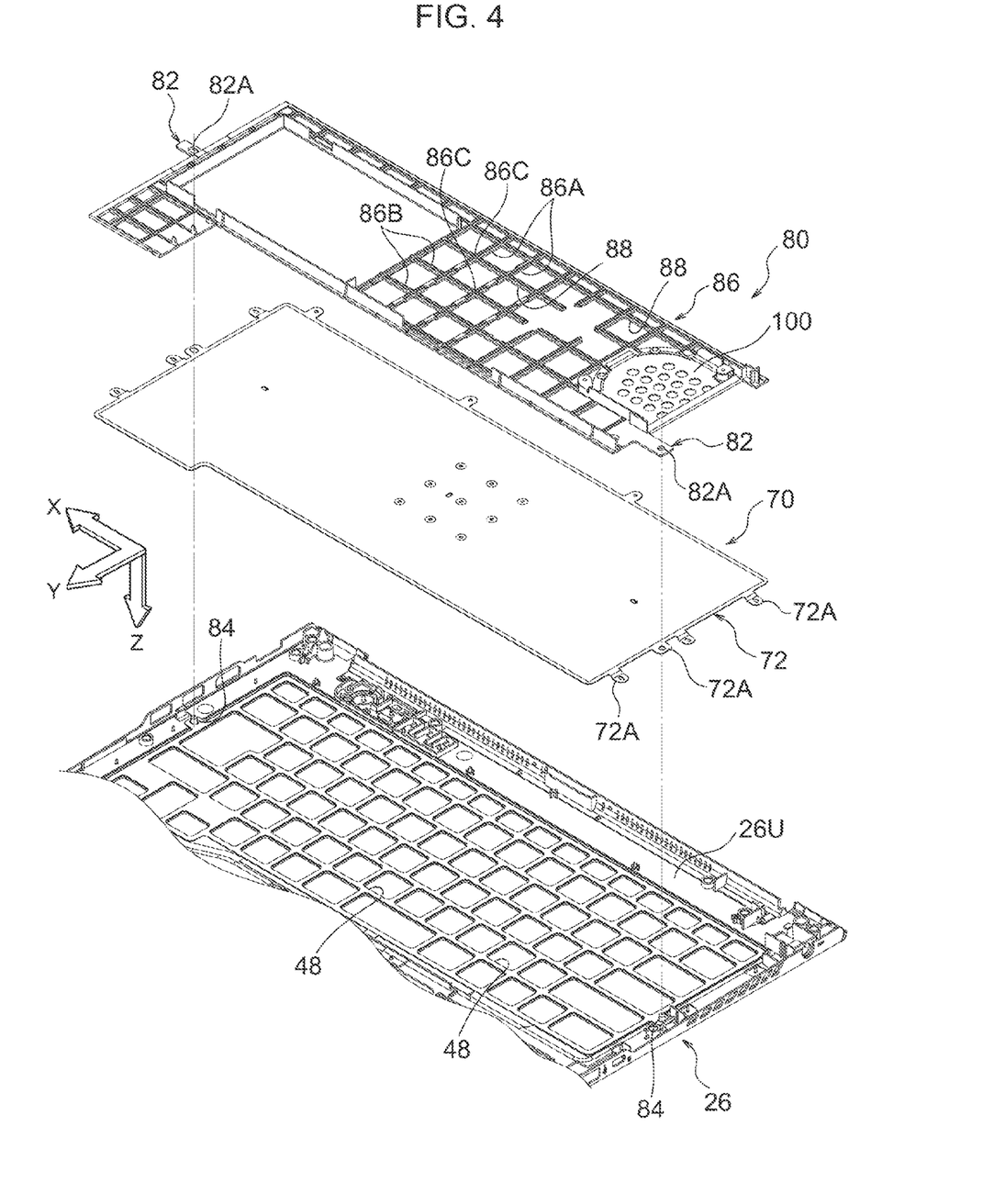
FIG. 4 is an exploded perspective view illustrating the upper case, keyboard and support frame illustrated in FIG. 2.
Figure 5:
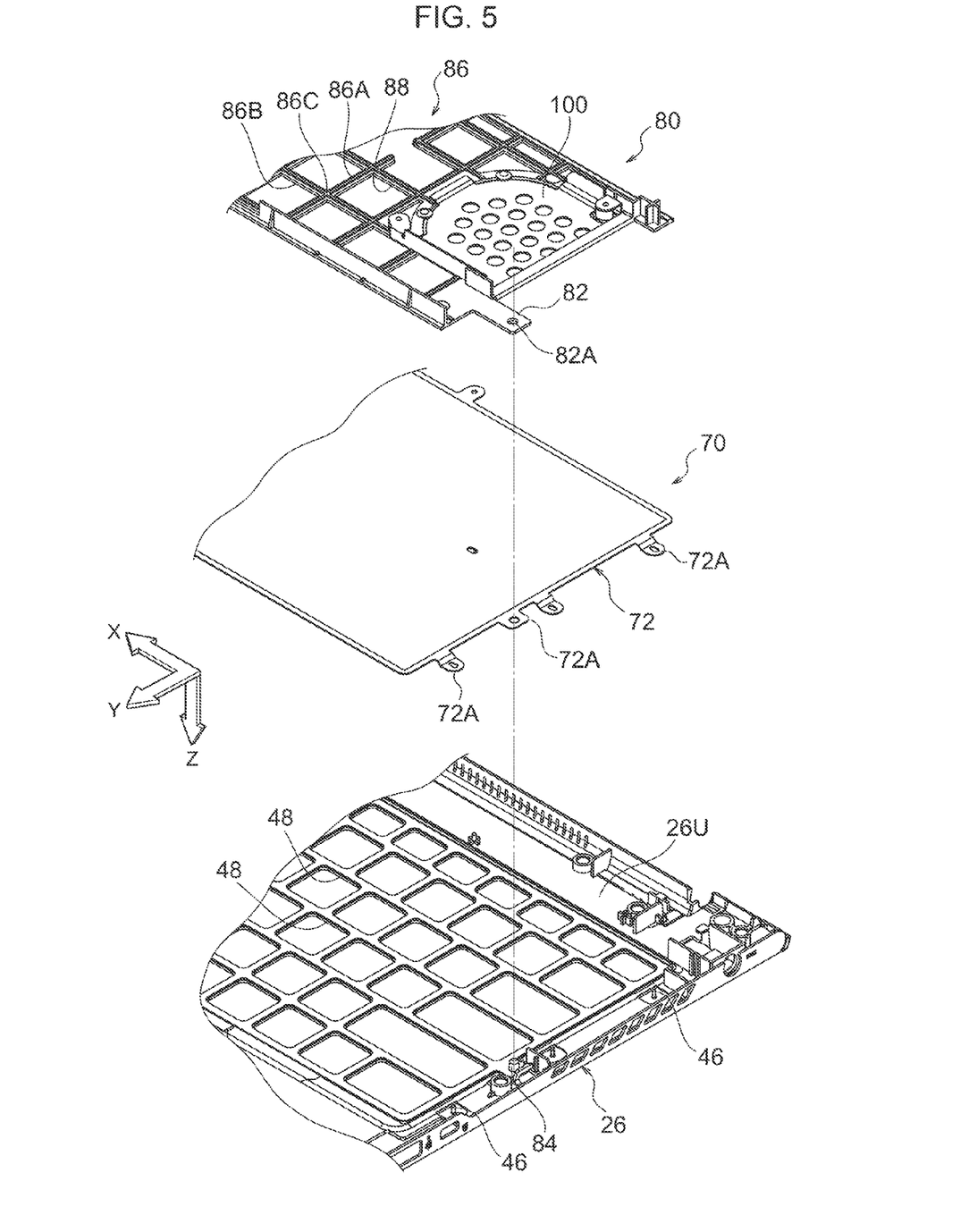
FIG. 5 is an enlarged exploded perspective view of FIG. 4.

More specifically, as illustrated in FIG. 4 and FIG. 5, the support frame 80 is superimposed with the upper case 26 at the lower side of the keyboard 70 (at the opposite side to the arrow Z direction). Brackets 82 are provided respectively to both length direction end portions of the support frame 80 and serve as an example of attachment portions. The support frame 80 is attached (fixed) to the upper case 26 by respectively inserting attachment pins 84 that project from the lower face of the upper wall portion 26U of the upper case 26 into attachment holes 82A formed in the brackets 82. Note that the attachment portions 72A provided to the base board 72 of the keyboard 70 are also respectively attached to the attachment pins 46.

As illustrated in FIG. 4, the lattice portion 86 of the support frame 80 is formed by joining plural lattice upright struts 86A and plural lattice cross struts 86B together in a lattice pattern. The plural lattice upright struts 86A extend in the device front-rear direction and are disposed at intervals along the device width direction. The plural lattice cross struts 86B extend in the device width direction and are disposed at intervals along the device front-rear direction. The lattice upright struts 86A and the lattice cross struts 86B are joined at intersection portions 86C where the lattice upright struts 86A and the lattice cross struts 86B intersect (intersect orthogonally) with each other. The lattice portion 86 is formed with plural openings 88 that are surrounded by the plural lattice upright struts 86A and lattice cross struts 86B. Electronic components mounted on the upper face 22U (see FIG. 2) of the printed circuit board 22 may be disposed inside the openings 88.

Figure 6:
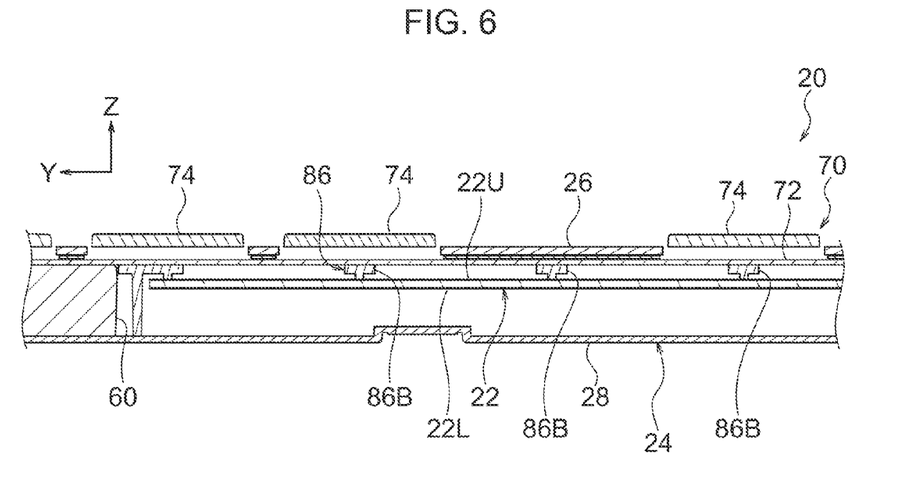
FIG. 6 is a cross-section taken along line 6-6 in FIG. 3.

As illustrated in FIG. 6, the lattice portion 86 thus formed in a lattice pattern is interposed between the keyboard 70 and the printed circuit board 22, and is housed inside the fixed side casing 24 in a stacked state with the keyboard 70 and the printed circuit board 22. Accordingly, at least a length direction intermediate portion of the base board 72 of the keyboard 70 is supported by the printed circuit board 22 through the lattice upright struts 86A and the lattice cross struts 86B of the lattice portion 86.

Figure 7:
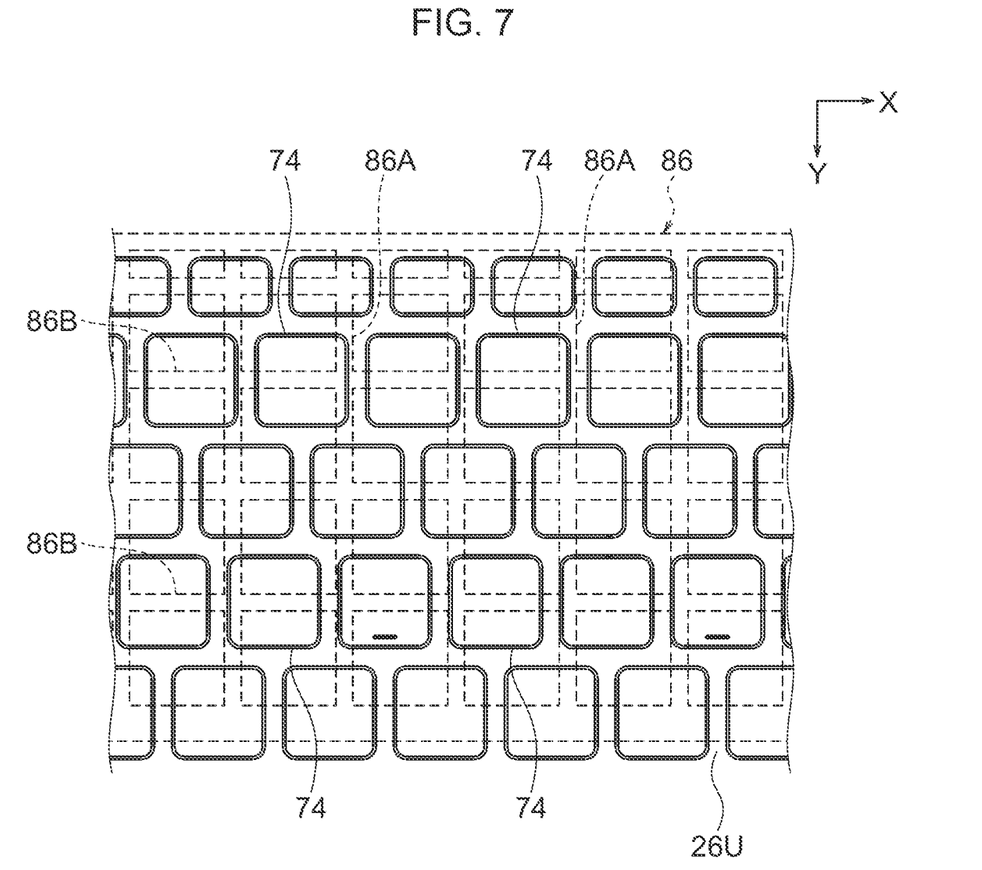
FIG. 7 is an enlarged plan view of FIG. 3.

As illustrated in FIG. 7, when seen in plan view each of the lattice cross struts 86B is disposed so as to overlap with the plural keys 74 arrayed along the device width direction (in the arrow X direction). In other words, when seen in plan view, each of the lattice cross struts 86B is disposed in the device width direction so as to respectively cut across the plural keys 74 arrayed along the device width direction. The keys 74 are accordingly supported through the base board 72 (see FIG. 2) by the lattice cross struts 86B when the keyboard 70 is typed on.

Note that in the present exemplary embodiment, each of the lattice cross struts 86B is disposed so as to overlap with device front-rear direction (arrow Y direction) central portions of the plural keys 74 arrayed along the device width direction when seen in plan view. In other words, each of the lattice cross struts 86B is disposed in the device width direction so as to cut across the device front-rear direction central portion of each of the plural keys 74 arrayed along the device width direction. Accordingly, the device front-rear direction central portions of the keys 74 are supported through the base board 72 by the lattice cross struts 86B when the keyboard 70 is typed on.

Figure 8:
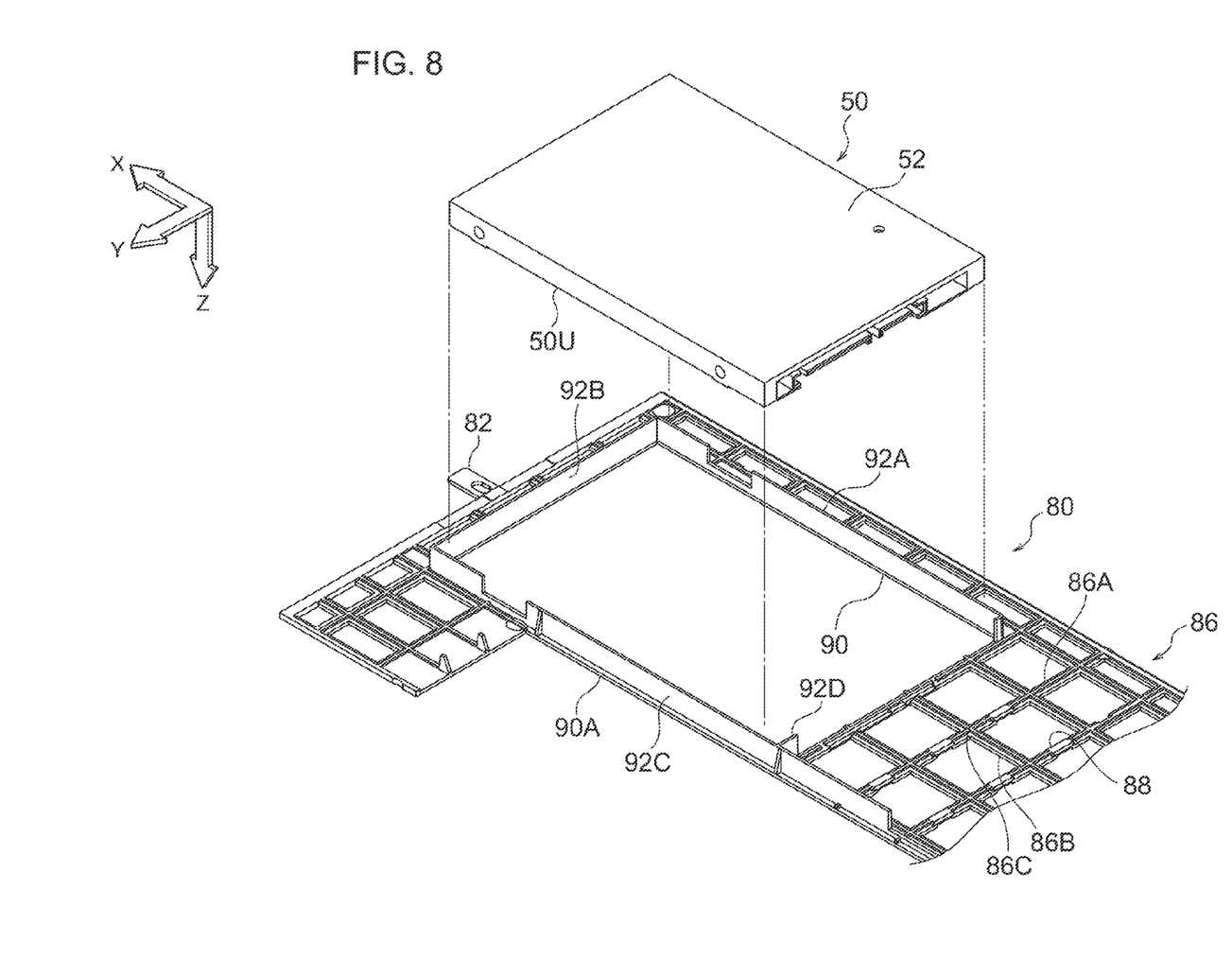
FIG. 8 is an exploded perspective view illustrating the storage device and support frame illustrated in FIG. 2.

As illustrated in FIG. 8, an expansion unit housing opening 90 is formed piercing through the lattice portion 86 in the board thickness direction at a length direction first end side (right hand side) of the support frame 80. The expansion unit housing opening 90 is formed with a rectangular shape in plan view corresponding to the external shape of the storage device 50. An upper end portion 50U of the storage device 50 is disposed (housed) inside the expansion unit housing opening 90. Plural expansion unit ribs 92A, 92B, 92C, 92D are provided to the lattice portion 86 so as to project from a peripheral rim portion 90A of the expansion unit housing opening 90 towards a bottom wall portion 28L of the lower case 28 (see FIG. 2). The expansion unit ribs 92A to 92D are formed in plate shapes disposed along the peripheral rim portion 90A of the expansion unit housing opening 90 so as to surround the storage device 50 housed in the expansion unit housing opening 90.

Figure 9A:
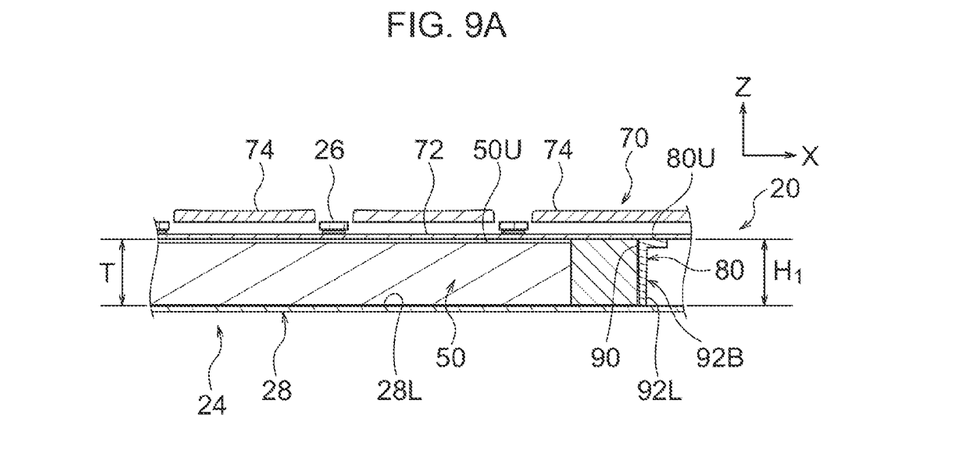
FIG. 9A is a cross-section taken along line 9A-9A in FIG. 3.
Figure 9B:
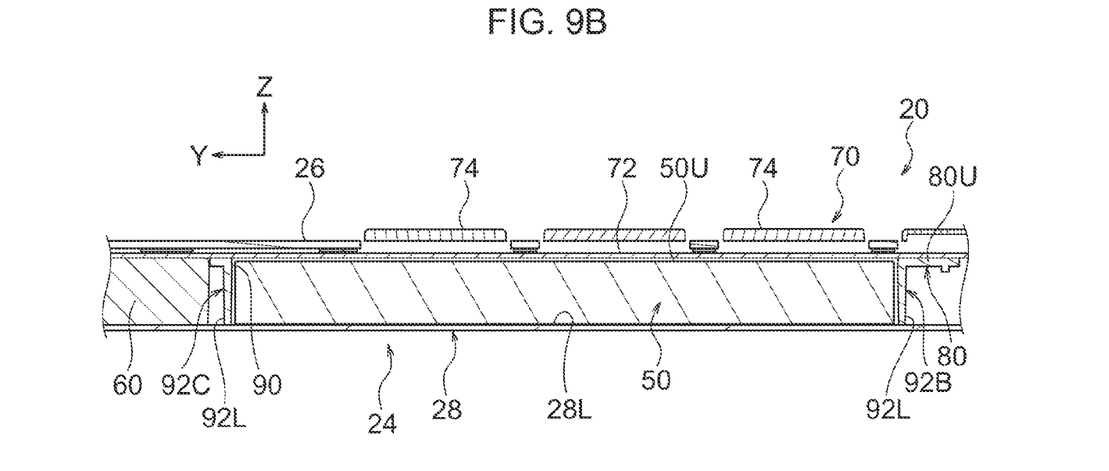
FIG. 9B is a cross-section taken along line 9B-9B in FIG. 3.

As illustrated in FIG. 9A and FIG. 9B, in a housed state in the fixed side casing 24, leading end portions (lower end portions) 92L of each of the expansion unit ribs 92A to 92D are in contact with the bottom wall portion 28L of the lower case 28. Note that the expansion unit rib 92D is not illustrated in FIG. 9A or FIG. 9B. As illustrated in FIG. 9A, a height (length) $H_1$ from the leading end of the expansion unit rib 92B to an upper face 80U of the support frame 80 (the lattice portion 86) is set higher than a height (length) T of the storage device 50. The upper end portion 50U of the storage device 50 accordingly does not project out from the upper face 80U of the support frame 80 towards the keyboard 70 side. Similarly, the heights from the leading ends of the other expansion unit ribs 92A, 92C, 92D to the upper face 80U of the support frame 80 are also set higher than the height (length) T of the storage device 50. The base board 72 above the storage device 50 is accordingly supported through the expansion unit ribs 92A to 92D by the bottom wall portion 28L of the lower case 28 when the keyboard 70 is typed on.

Figure 10:
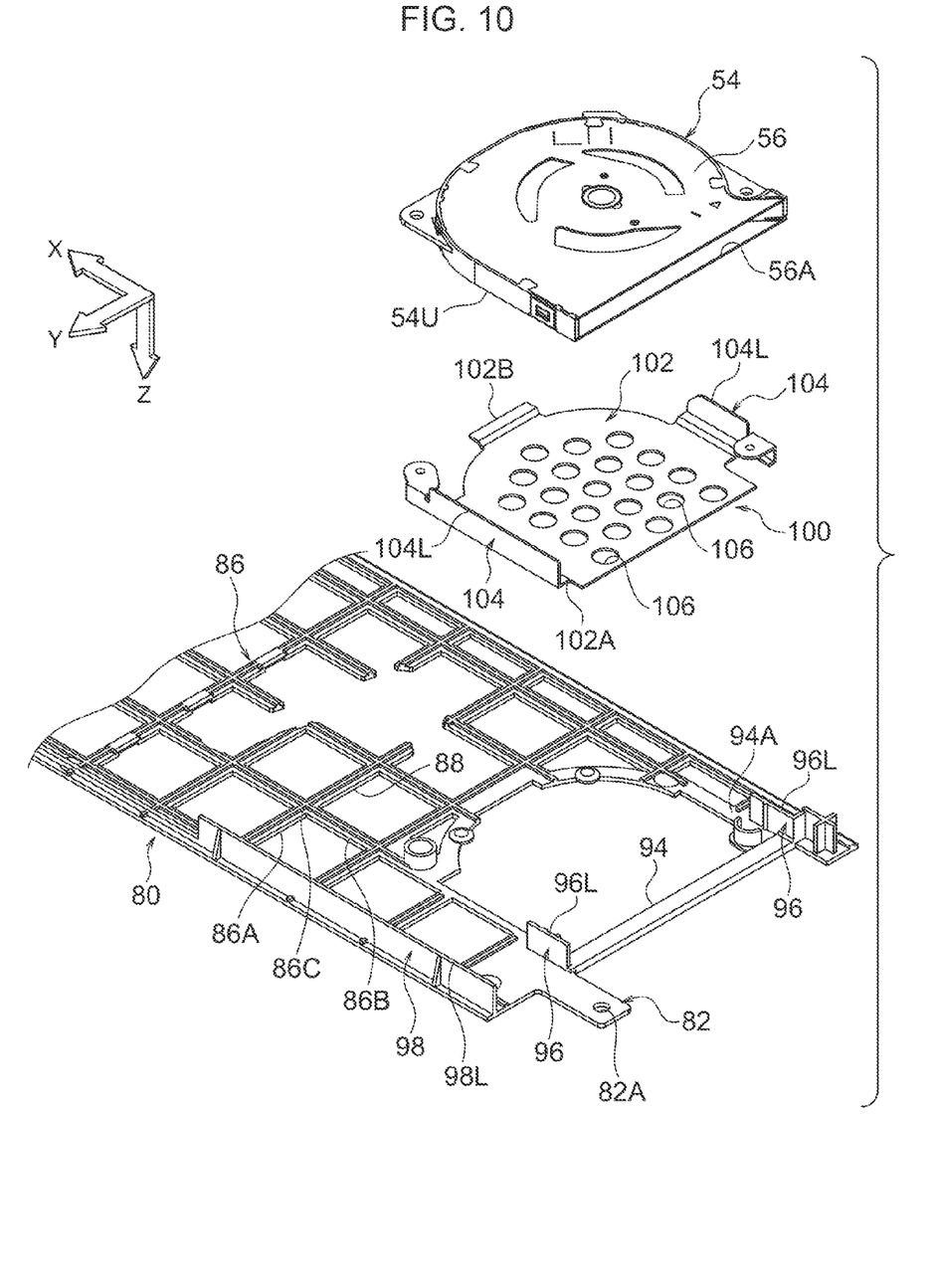
FIG. 10 is an exploded perspective view illustrating the support frame, cover and fan unit illustrated in FIG. 2.

As illustrated in FIG. 10, a cooling unit housing opening 94 is formed piercing through the lattice portion 86 in the board thickness direction at a length direction second end side (left hand side) of the support frame 80. The cooling unit housing opening 94 is formed with a semicircular shape in plan view corresponding to the external shape of an upper portion of the fan unit 54. An upper end portion 54U of the fan unit 54 is disposed (housed) inside the cooling unit housing opening 94. A pair of cooling unit ribs 96 are provided to the lattice portion 86 so as to project from a peripheral rim portion 94A of the cooling unit housing opening 94 towards the bottom wall portion 28L of the lower case 28 (see FIG. 2).

The pair of cooling unit ribs 96 are formed in plate shapes provided to the peripheral rim portion 94A of the cooling unit housing opening 94 so as to face each other along the device front-rear direction at the second end side of the support frame 80. Similarly to the expansion unit ribs 92A to 92D, leading end portions (lower end portions) 96L of the pair of cooling unit ribs 96 are in contact with the bottom wall portion 28L of the lower case 28 when in a housed state in the fixed side casing 24. Moreover, the height from the leading ends of the cooling unit ribs 96 to the upper face 80U of the support frame 80 (the lattice portion 86) is set higher than a height F of the fan unit 54 (see FIG. 11). The base board 72 above the fan unit 54 is accordingly supported through the pair of cooling unit ribs 96 by the bottom wall portion 28L of the lower case 28 when the keyboard 70 is typed on.

Note that a support rib 98 is provided to a front end portion of the length direction second end portion of the support frame 80. The support rib 98 is configured similarly to the cooling unit ribs 96. The base board 72 of the keyboard 70 is accordingly supported through the support rib 98 by the bottom wall portion 28L of the lower case 28 when the keyboard 70 is typed on.

A metal cover 100 covering the fan unit 54 is attached to the length direction second end side of the support frame 80. The cover 100 includes a cover body portion 102 that covers the fan unit 54 from the keyboard 70 (see FIG. 11) side and a pair of side wall portions 104 that extend from a peripheral rim portion 102A of the cover body portion 102 towards the lower case 28 (see FIG. 11) side. The cover 100 is attached to the lattice portion 86 by inserting the cover 100 into the cooling unit housing opening 94 from the lower case 28 side and engaging an engagement portion 102B provided to the cover body portion 102 with the peripheral rim portion 94A of the cooling unit housing opening 94. Note that for weight reduction purposes plural through holes 106 are formed in the cover body portion 102.

Figure 11:
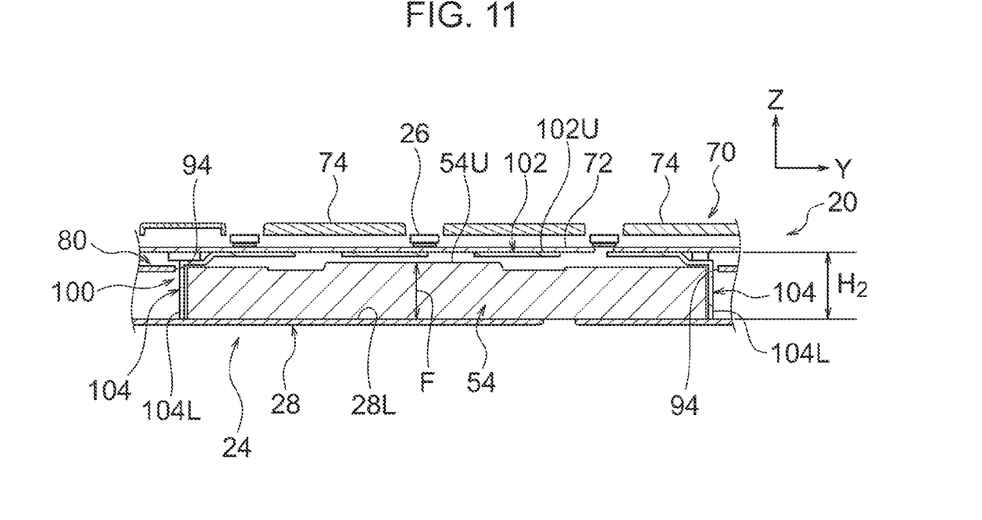
FIG. 11 is a cross-section taken along line 11-11 in FIG. 3.

The pair of side wall portions 104 are formed in plate shapes disposed facing each other along the device front-rear direction. As illustrated in FIG. 11, the fan unit 54 is disposed between the pair of side wall portions 104. The pair of side wall portions 104 respectively face the side faces of the fan unit 54. Lower end portions 104L of each of the side wall portions 104 are in contact with the bottom wall portion 28L of the lower case 28 when in a housed state in the fixed side casing 24. A height $H_2$ from the lower ends of the side wall portions 104 to an upper face 102U of the cover body portion 102 of the cover 100 is set higher than the height F of the fan unit 54. The base board 72 above the fan unit 54 is accordingly supported by the bottom wall portion 28L of the lower case 28 through the pair of side wall portions 104 when the keyboard 70 is typed on.

Explanation follows regarding operation of the present exemplary embodiment.

As illustrated in FIG. 6, the support frame 80 is interposed between the keyboard 70 and the printed circuit board 22. The keyboard 70, the support frame 80 and the printed circuit board 22 are attached to the upper case 26 in a stacked state. Since the keyboard 70 is supported with respect to the printed circuit board 22 by the lattice portion 86 of the support frame 80, flexing of the base board 72 of the keyboard 70 when the keyboard 70 is typed on is suppressed. The typing characteristics (operability of the keyboard 70) are accordingly enhanced for the user.

The support frame 80 includes the lattice portion 86 formed in a lattice pattern. The lattice portion 86 is formed with the plural openings 88 surrounded by the plural lattice upright struts 86A and lattice cross struts 86B. The lattice portion 86 can accordingly be placed on the upper face 22U of the printed circuit board 22 by the electronic components mounted on the upper face 22U side of the printed circuit board 22 being disposed (inserted) inside the openings 88. A gap between the lattice portion 86 and the printed circuit board 22 can accordingly be eliminated. A reduction in thickness of the fixed side casing 24 can accordingly be achieved. That is to say, in the present exemplary embodiment a reduction in thickness can be achieved for the fixed side casing 24 whilst still suppressing flexing of the keyboard 70 (the base board 72) caused by typing.

Moreover, in the present exemplary embodiment, the support frame 80 is formed from resin. A cost saving can accordingly be achieved since there is no need to perform for example insulation treatment to the upper face 22U of the printed circuit board 22.

Furthermore, as illustrated in FIG. 7, the lattice cross struts 86B of the lattice portion 86 are disposed so as to overlap with the plural keys 74 arrayed along the device width direction as seen in plan view. Locations on the base board 72 that are directly pressed by the keys 74 are accordingly supported by the printed circuit board 22 through the lattice cross struts 86B when the keyboard 70 is typed on. Flexing of the base board 72 can accordingly be suppressed. In particular, in the present exemplary embodiment, each of the lattice cross struts 86B of the lattice portion 86 are disposed so as to overlap with the device front-rear direction central portions of the plural keys 74 arrayed along the device width direction when seen in plan view. Accordingly, when the keyboard 70 is typed on, the device front-rear direction central portions of the plural keys 74 arrayed along the device width direction are supported through the lattice cross struts 86B by the printed circuit board 22. Flexing of the base board 72 can accordingly be further suppressed.

As illustrated in FIG. 3, in the present exemplary embodiment the storage device 50 and the fan unit 54 are housed at the rear side of the fixed side casing 24 so as to overlap with the keyboard 70 in plan view. The device width direction width (length) of the housing space for the battery 60 provided at the front side of the fixed side casing 24 is accordingly increased. A reduction in thickness of the battery 60 is accordingly achievable whilst still securing the capacity of the battery 60. A reduction in thickness can be achieved for the fixed side casing 24 as a result. Moreover, the amount of heat transmitted to for example the wrists of the user is reduced due to housing the battery 60, which generates less heat than the storage device 50, at the front side of the fixed side casing 24, namely at the palm rest portion 26P side of the upper case 26.

There is a possibility that by overlapping the storage device 50 and the fan unit 54 with the keyboard 70 in plan view, the storage device 50 and the fan unit 54 would impinge on the support frame 80 and lead to an increase in the thickness of the fixed side casing 24. On the other hand, in the present exemplary embodiment the expansion unit housing opening 90 and the cooling unit housing opening 94 are formed at portions of the lattice portion 86 of the support frame 80 such that the storage device 50 and the fan unit 54 do not impinge on the support frame 80.

More specifically, as illustrated in FIG. 8, FIG. 9A and FIG. 9B, the expansion unit housing opening 90 is formed at the length direction first end side of the lattice portion 86. Due to the upper end portion 50U of the storage device 50 being disposed in the expansion unit housing opening 90A, a reduction in thickness can be achieved for the fixed side casing 24 in comparison to cases in which, for example, the lattice portion 86 is disposed above the upper end portion 50U of the storage device 50 and the lattice portion 86 impinges on the storage device 50.

The plural expansion unit ribs 92A to 92D are provided to the peripheral rim portion 90A of the expansion unit housing opening 90. The leading end portions 92L of each of the expansion unit ribs 92A to 92D contact the bottom wall portion 28L of the lower case 28. The base board 72 above the storage device 50 is accordingly supported through the expansion unit ribs 92A to 92D by the bottom wall portion 28L of the lower case 28 when the keyboard 70 is typed on. The amount of flexing of the base board 72 above the storage device 50 can accordingly be reduced. Consequently, the pressure that acts on the upper end portion 50U of the storage device 50 from the base board 72 is reduced as a result of the reduction in the amount flexing of the base board 72. Hence damage to the storage device 50 is accordingly suppressed.

As illustrated in FIG. 10 and FIG. 11, the cooling unit housing opening 94 is formed to the length direction second end side of the lattice portion 86. Due to the upper end portion 54U of the fan unit 54 being disposed in the cooling unit housing opening 94, a reduction in thickness can be achieved for the fixed side casing 24 in comparison to cases in which for example the lattice portion 86 is disposed above the upper end portion 54U of the fan unit 54 and the lattice portion 86 impinges on the upper end portion 54U.

The cooling unit ribs 96 are provided to the peripheral rim portion 94A of the cooling unit housing opening 94. The leading end portions 96L of the cooling unit ribs 96 contact the bottom wall portion 28L of the lower case 28, similarly to in the expansion unit housing opening 90. The base board 72 above the fan unit 54 is accordingly supported by the bottom wall portion 28L of the lower case 28 through the cooling unit ribs 96 when the keyboard 70 is typed on. The amount of flexing in the base board 72 above the fan unit 54 is accordingly reduced. Consequently, the pressure that acts on the upper end portion 54U of the fan unit 54 from the base board 72 is reduced as a result of the reduction in the amount of flexing of the base board 72. Damage to the fan unit 54 is accordingly suppressed.

The metal cover 100 is attached to the cooling unit housing opening 94. The upper end portion 54U of the fan unit 54 is covered from the keyboard 70 side by the cover body portion 102 of the cover 100. Moreover, similarly to the pair of cooling unit ribs 96, the lower end portions 104L of the pair of side wall portions 104 provided to the peripheral rim portion 102A of the cover body portion 102 contact the bottom wall portion 28L of the lower case 28. The base board 72 above the fan unit 54 is accordingly supported by the bottom wall portion 28L of the lower case 28 through the cover body portion 102 and the pair of side wall portions 104 of the cover 100 when the keyboard 70 is typed on. The amount of flexing in the base board 72 above the fan unit 54 is accordingly further reduced, and pressure that acts on the upper end portion 54U of the fan unit 54 from the base board 72 is also further reduced.

Moreover, the cover 100 is formed from metal. Accordingly, the plate thickness of the cover body portion 102 of the cover 100 can be made thinner whilst still securing strength in comparison to cases in which the cover 100 is formed from resin. A reduction in thickness can accordingly be achieved for the fixed side casing 24.

Next, explanation follows regarding modified examples of the electronic device according to the present exemplary embodiment.

In the above exemplary embodiment, an example has been given in which the leading end portions 92L of the expansion unit ribs 92A to 92D respectively contact the bottom wall portion 28L of the lower case 28, however there is no limitation thereto. For example, configuration may be made wherein a gap is present between each of the leading end portions 92L of the expansion unit ribs 92A to 92D and the bottom wall portion 28L of the lower case 28, and the leading end portions 92L of the expansion unit ribs 92A to 92D are respectively made to contact the bottom wall portion 28L of the lower case 28 when the keyboard 70 is typed on. Similarly to in the above exemplary embodiment, the amount of flexing of the base board 72 above the storage device 50 is reduced since the keyboard 70 is supported through the expansion unit ribs 92A to 92D by the bottom wall portion 28L of the lower case 28. Similar configurations are also possible for the cooling unit ribs 96 and the side wall portions 104 of the cover 100. Moreover, appropriate changes may be made to the placement, shape, and number of the expansion unit ribs 92A to 92D, the cooling unit ribs 96, and the side wall portions 104 of the cover 100.

In the above exemplary embodiment, an example has been given in which each of the lattice cross struts 86B of the lattice portion 86 overlap with the plural keys 74 aligned along the device width direction as seen in plan view, however there is no limitation thereto. The plural lattice cross struts 86B do not necessarily have to overlap in plan view with the plural keys 74 arrayed along the device width direction. However, it is preferable for at least one of the lattice cross struts 86B to overlap with the plural keys 74 arrayed along the device width direction from the perspective of suppressing flexing of the keyboard 70.

Figure 12:
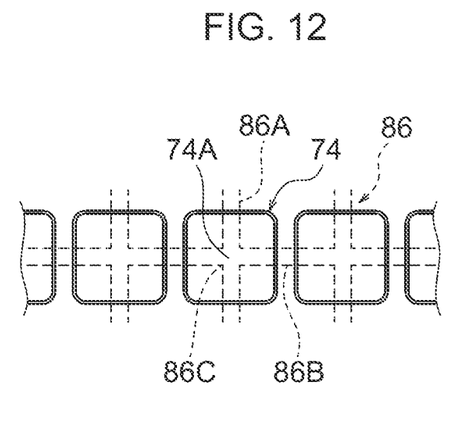
FIG. 12 is a plan view illustrating a modified example of the electronic device illustrated in FIG. 1, corresponding to the expanded drawing of FIG. 3.

As illustrated in FIG. 12, the intersection portions 86C of the lattice upright struts 86A and the lattice cross struts 86B may be configured so as to overlap with central portions 74A of the keys 74 in plan view. Accordingly, when the keyboard 70 is typed on, flexing of the keyboard 70 is further suppressed since the central portions 74A of the keys 74 are supported by the intersection portions 86C of the lattice upright struts 86A and the lattice cross struts 86B. The number and placement of the lattice upright struts 86A and the lattice cross struts 86B may be varied as appropriate.

In the above exemplary embodiment, an example has been given in which the storage device 50 and the fan unit 54 overlap with the keyboard 70 in plan view, however there is no limitation thereto. The storage device 50, or the fan unit 54, or the storage device 50 and the fan unit 54 may overlap with the keyboard 70 in plan view. The placement of the storage device 50 and the fan unit 54 may also be varied as appropriate.

In the above exemplary embodiment, an example has been given in which the fan unit 54 is covered from the keyboard 70 side by the cover 100, however the cover 100 may be omitted as appropriate. The cooling unit ribs 96 provided to the peripheral rim portion 94A of the cooling unit housing opening 94 may also be omitted as appropriate. Namely the cover 100, or the cooling unit ribs 96, or the cover 100 and the cooling unit ribs 96 may be formed to the lattice portion 86 when the cooling unit housing opening 94 is formed to the lattice portion 86.

In the above exemplary embodiment, an example has been given in which the lattice portion 86 is provided spanning the entire region of the support frame 80, however there is no limitation thereto. For example, the lattice portion 86 may be provided to a portion of the support frame 80.

In the above exemplary embodiment, an example has been given in which the support frame 80 is formed from resin, however there is no limitation thereto. The support frame 80 may also be formed from metal. In such cases, it is preferable to perform insulation treatment to the support frame 80, or to the printed circuit board 22, or to the support frame 80 and the printed circuit board 22.

In the above exemplary embodiment, explanation has been given of the notebook PC 10 as an example of an electronic device, however the above exemplary embodiment may also be applied to electronic devices such as mobile telephones, portable DVD players or electronic dictionaries.

Explanation has been given above of an exemplary embodiment of the technology disclosed herein, however the technology disclosed herein is not limited to the above exemplary embodiment. Moreover, it should be understood that appropriate combinations of the above exemplary embodiment and the various modified examples may be employed and various embodiments may be implemented within a range not departing from the spirit of the technology disclosed herein.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising:
   a printed circuit board;
   a casing including an upper case that covers the printed circuit board from an upper face side and a lower case that covers the printed circuit board from a lower face side, the casing housing the printed circuit board;
   a keyboard interposed between the printed circuit board and the upper case;
   an expansion unit interposed between the keyboard and the lower case; and
   a support member including a lattice portion that is interposed between the keyboard and the printed circuit board and that supports the keyboard with respect to the printed circuit board, with a portion of the lattice portion formed with an expansion unit housing opening that the expansion unit is disposed in, and the lattice portion being provided with an expansion unit rib that projects from a peripheral rim portion of the expansion unit housing opening towards a bottom wall portion of the lower case.

2. The electronic device of claim 1, wherein a leading end portion of the expansion unit rib contacts the bottom wall portion of the lower case.

3. The electronic device of claim 1 further comprising:
- a cooling unit interposed between the keyboard and the lower case; and
- a cooling unit housing opening that the cooling unit is disposed in formed to a portion of the lattice portion.

4. The electronic device of claim 3, wherein the lattice portion is provided with a cooling unit rib that projects from a peripheral rim portion of the cooling unit housing opening towards the bottom wall portion of the lower case.

5. The electronic device of claim 4, wherein a leading end portion of the cooling unit rib contacts the bottom wall portion of the lower case.

6. The electronic device of claim 3 further comprising a cover that is made from metal and is attached to the support member that is made from resin, the cover including:
- a cover body portion that covers the cooling unit disposed in the cooling unit housing opening from the keyboard side; and
- a side wall portion that extends from a peripheral rim portion of the cover body portion towards the lower case, with a lower end portion of the side wall portion contacting the bottom wall portion of the lower case.

7. The electronic device of claim 1 wherein:
the keyboard includes a plurality of keys arrayed along the front-rear direction and the width direction of the casing;
the lattice portion includes
- a plurality of lattice upright struts that extend in the casing front-rear direction and are disposed at intervals along the casing width direction, and
- a plurality of lattice cross struts that extend in the casing width direction, that are disposed at intervals along the casing front-rear direction and that are joined in a lattice pattern to the plurality of lattice upright struts; and at least one of the plurality of lattice cross struts overlaps with the plurality of keys arrayed along the casing width direction as seen in plan view.

8. The electronic device of claim 1 further comprising a battery that is stored inside the casing and that is disposed at the casing front-rear direction front side with respect to the expansion unit.

9. The electronic device of claim 3 wherein:
the keyboard is disposed with the length direction oriented in the casing width direction;
the expansion unit is disposed at a length direction first end side of the keyboard;
the cooling unit is disposed at a length direction second end side of the keyboard; and
the lattice portion supports at least a length direction intermediate portion of the keyboard.

10. The electronic device of claim 1, wherein the expansion unit is a storage device.

11. The electronic device of claim 3 wherein:
a heat sink that is provided to the electronic device housed inside the casing with coolant circulated between the heat sink and an electronic component mounted to the printed circuit board; and
the cooling unit is a fan unit that blows cooling air towards the heat sink.

12. The electronic device of claim 7, wherein at least one of intersection portions between the lattice cross struts and the lattice upright struts overlaps with a central portion of the plurality of keys in plan view.

13. The electronic device of claim 1, wherein the electronic device is a notebook personal computer.

* * * * *